United States Patent [19]
McAllister et al.

[11] Patent Number: 5,264,664
[45] Date of Patent: Nov. 23, 1993

[54] PROGRAMMABLE CHIP TO CIRCUIT BOARD CONNECTION

[75] Inventors: Michael F. McAllister, Clintondale; James A. McDonald, Newburgh, both of N.Y.

[73] Assignee: International Business Machines Corporation, Armonk, N.Y.

[21] Appl. No.: 870,859

[22] Filed: Apr. 20, 1992

[51] Int. Cl.$^5$ .............................. H05K 1/00
[52] U.S. Cl. .................... 174/261; 174/262; 361/777
[58] Field of Search ............ 174/260, 262, 261; 361/400, 409, 410

[56] References Cited

U.S. PATENT DOCUMENTS

| | | |
|---|---|---|
| 4,150,421 | 4/1979 | Nishihara et al. |
| 4,674,182 | 6/1987 | Igarashi . |
| 4,723,197 | 2/1988 | Takiar et al. . |
| 4,729,061 | 3/1988 | Brown . |
| 4,993,954 | 2/1991 | Prevost . |
| 5,081,561 | 1/1992 | Smith . |

Primary Examiner—Leo P. Picard
Assistant Examiner—Cheryl R. Figlin
Attorney, Agent, or Firm—Whitham & Marhoefer

[57] ABSTRACT

A carrier module such as a chip carrier or a circuit board has a matrix of programmable connection pads for attaching a VHDLSI chip. Each pad is encircled by circuit elements (lines or vias) providing different power or signals and one of the lines or vias is selectively connected to the pad to program the connection. The pads have cut outs at the connection points to the vias and/or lines in order to simplify making of connections. The programming connections between the vias and/or lines and the pads are made after pre-finishing the board by depositing evaporated metal to form a bridge between each pad and a via or line selected for each pad. Then a passivation layer of polyimide is deposited on the vias and/or lines with an aperture at the center of each pads so that solder connections to attach the chip to the carrier module do not erroneously bridge to additional vias and/or lines.

12 Claims, 3 Drawing Sheets

PROGRAMMABLE CHIP TO CIRCUIT BOARD CONNECTION

BACKGROUND OF THE INVENTION

1. Field of the Invention

The present invention generally relates to connection modules such as chip carriers and circuit boards on which electronic chips are mounted and, more specifically, to the connections between the chips and connection modules.

2. General Description of Background

In VLSI (Very Large Scale Integration) design there is a trend to improve utilization of available circuits in order to achieve both improved performance and higher densities. To facilitate such reuse, circuits have been divided up into large functional elements known as macros, cells or blocks. Such elements are positioned on the chip much like chips are positioned on circuit boards. For example, in ASIC (Application Specific Integrated Circuits) the use of existing elements is optimized to improve density and obtain better performance.

During design refinement, as such elements are replaced and repositioned to improve performance/density, there is a need for revising the arrangement of power/signal connections of the chip, known as the footprint of the chip. Previously, however, the power/signal footprint could not be changed without reworking existing connection modules or, more likely, scrapping any existing connection modules such as circuit boards or chip carriers and redesigning, tooling and manufacturing new connection modules. Therefore, cell utilization has been less than optimum or costs have been higher due to replacement of such connection modules.

Even for chips which are not designed using macro methods, as the design is refined, unexpected contentions for input/output (I/O) of power or signals develop in the same areas of the chip so that the power/signal footprint needs to be revised to provide optimum chip design.

Previously, circuit boards have been customized for specific applications so that boards designed for one chip set could not be used for another chip set. This was true even if a similar function was to be performed. This has lead to extensive costs in redesign of circuit boards and retooling of manufacture for each new application and also in the longer lead times which redesign and retooling require.

Due to design considerations, different chips are often developed which are functionally similar. Later, in order to reduce manufacturing and inventory costs, as electronic densities on chips improve, the different chips are replaced by a single manufacture capable of being programmed for replacing either of the prior chips. For example, cutting a single trace or applying a high voltage to some contact on the chip will provide for modifying the chip to perform different functions. However, where different chips have different power/signal footprints, producing a single replacement has proved more difficult.

SUMMARY OF THE INVENTION

It is therefore an object of the present invention to provide a connection module which can accommodate changes in the power/signal footprint of the chip without extensive rework.

It is also an object of this invention to provide a connection module which can be easily utilized to allow performing different functions.

It is further an object of this invention to provide a chip which can be programmed to provide different power/signal footprints.

In the invention, circuit elements (vias or lines) for conducting power and signals are positioned on the surface of a pre-finished carrier module proximate to connectors for electrical connection to a chip. The connectors are programmed by bridging between one of the proximate circuit elements and the connector.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1:
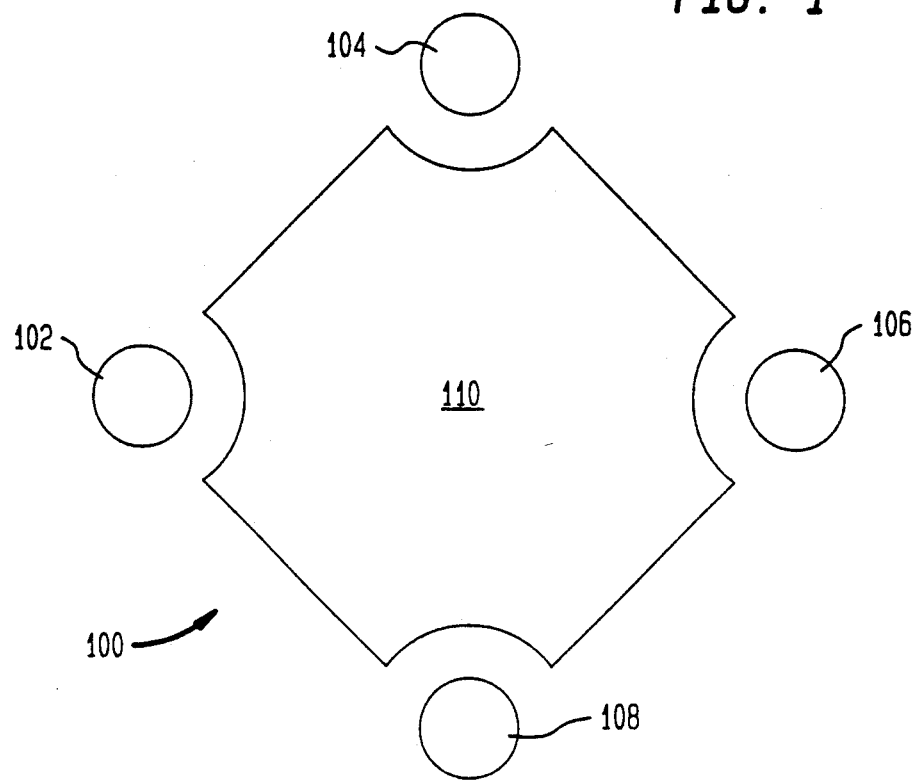
FIG. 1 is a plan view of a specific embodiment of the connection pad of this invention on the surface of the carrier module showing the ends of vias arranged about a central land prior to programming.

Referring now to the drawings, and more particularly to FIG. 1, there is shown connection pad 100 with signal via 102 and three potential vias 104 at 3.6 volts, 106 at 1.9 volts and 108 at ground voltage level circling about central land 110. These voltages are for purposes of illustration only and not limitation. There is a non-conductive spacing between each via 102, 104, 106, and 108 and central land 110. Each of the vias 102, 104, 106, and 108 are selectively connectable to central land 110. As will be discussed below, the central land 110 and the vias 102, 104, 106, and 108 are positioned on a carrier module such as a printed circuit board or chip carrier. Preferably, central land 110 is a thin film layer or decal produced by photoprocessing techniques, laser or ion beam ablation followed by plate up techniques, decal stamping, or any other suitable method. Preferably, the vias 102, 104, 106, and 108 rise from mesh planes (not shown) within a multilayer carrier module and are produced by mechanical punching followed by plate up, fine ion beam, electron beam and laser beam techniques, or other suitable procedures. While FIG. 1 shows a total of four vias, it should be understood that any number of vias can be positioned about central land 110. Preferably, the number of vias ranges between two and eight and allows connections to different potentials and signals. As will be discussed below in conjunction with FIG. 3, a signal or potential line that is a thin film surface trace on the carrier module, rather than a via, can also be selectively connectable to the central land 110 in the same manner as vias 102, 104, 106, and 108.

Figure 2:
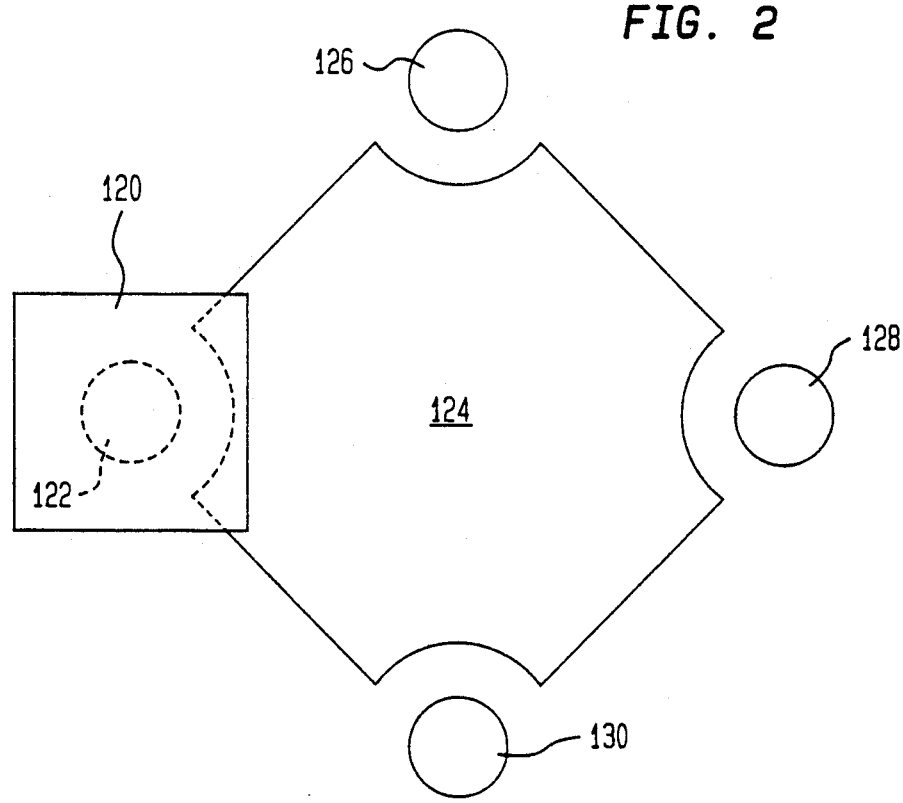
FIG. 2 is a plan view of the embodiment of FIG. 1 illustrating a connection pad programmed by connecting a via to the central land.

As shown in FIG. 2, a final evaporation of metal is made to produce a bridge 120 to connect between one of the vias 122 (shown as hidden by the bridge) and the central land 124. The other vias 126, 128 and 130 remain disconnected from the central land. In this way, the connection of a potential or signal at central land 124 is programmed to accommodate circuitry on the chip which will be attached to the central land 124. Hence, several different chip foot prints are accommodated by this invention. The bridge 120 may be formed by other techniques such as sputtering, laser deposition, fine ion beam writing, direct write followed by plate up, or the like.

Advantageously, this connection pad invention allows for programming connections after the carrier module is otherwise manufactured so that inventory can be minimized. Identical unprogrammed carrier modules can be manufactured for use in different applications and finished cards can be reworked for another function simply by reprogramming the connections. For example, bridge 120 could be cut and a similar bridge produced between central land 124 and via 126 (or via 128 or via 130).

The invention is especially advantageous for VHDLSI (very high density large scale integration) chips, which use macro design methods. During design refinement the power/signal footprint of the chip can be changed without requiring a redesign of the carrier module. This invention provides more flexibility in the design of chips and carrier modules and reduces turn around time, scrap, rework and inventory requirements.

Figure 3:
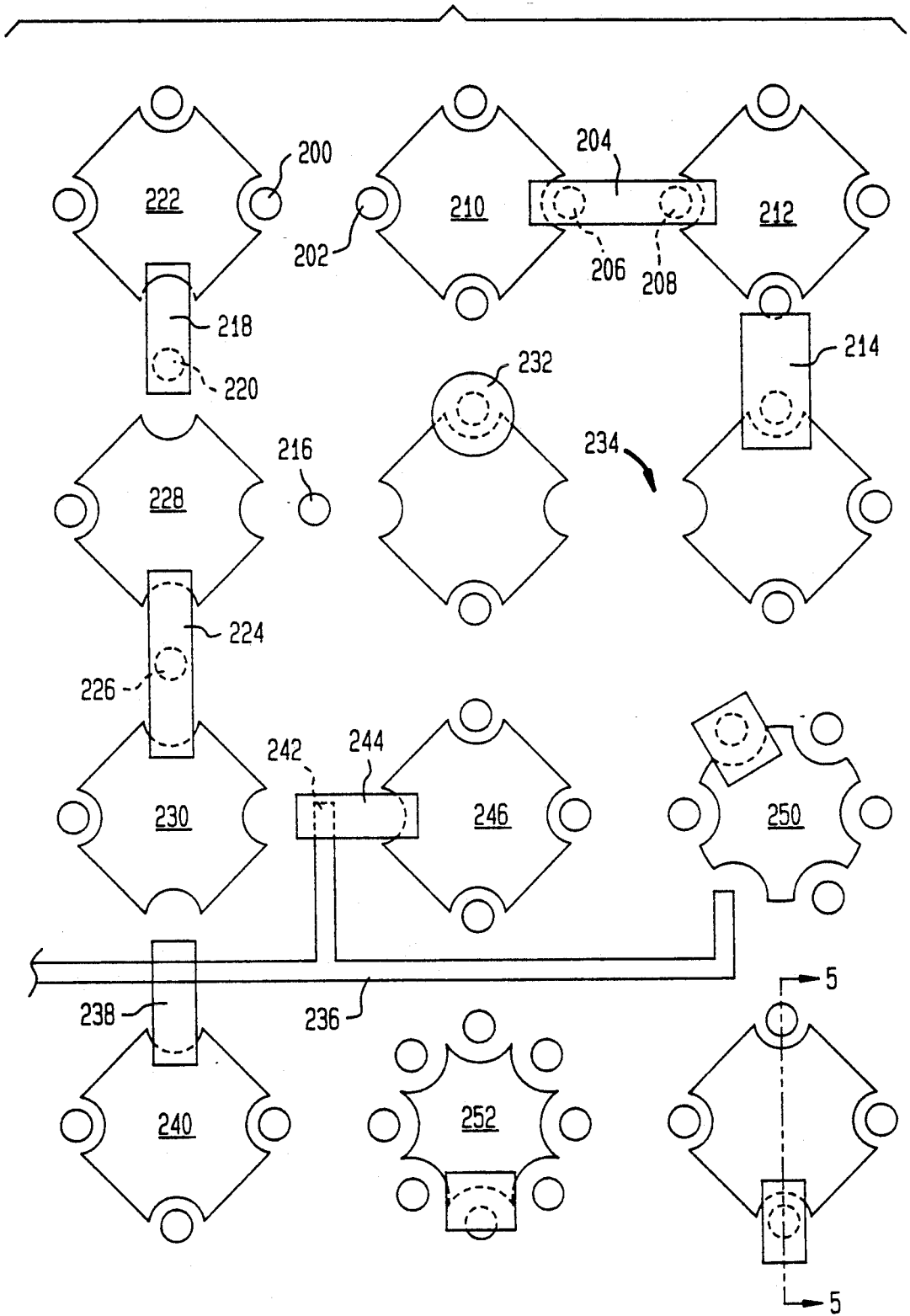
FIG. 3 illustrates an array of connection pads for connecting a chip to the carrier module of this invention and showing alternate embodiments of the connection pads and alternate programming of the pads.

The array of connection pads in FIG. 3, connect between the carrier module and a chip. Adjacent vias 200 and 202 preferably have the same potential so that a single bridge may be used to two different lands. This concept is best demonstrated by bridge 204 spanning over vias 206 and 208 (shown in hidden lines) and central lands 210 and 212. In this way, small overextension errors such as at bridge 214 are not critical. Alternately, a single via such as 216 may be positioned between central lands so that bridge 218 may connect the single via 220 (shown hidden) to central land 222 or a single bridge 224 can connect via 226 (shown in hidden lines) to both central lands 228 and 230. A non-rectangular shaped bridge 232 may be used and vias may be intentionally omitted as shown at 234. Thin film trace or line 236 can be connected along its length by bridge 238 to pad 240 or the trace end 242 may be connected by bridge 244 to pad 246. Connection pads may be surrounded by different numbers of vias. For example, central land 250 is surrounded by a circle of six vias as shown and central land 252 is surrounded by eight vias.

Figure 4:
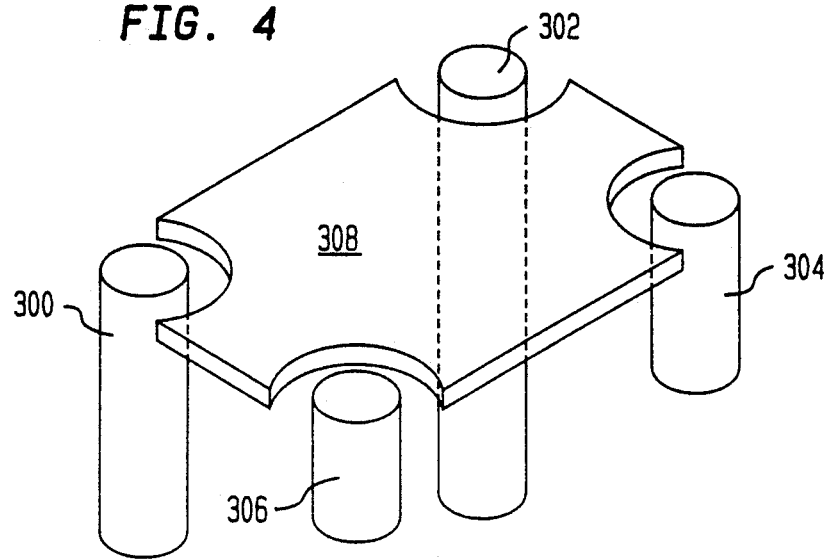
FIG. 4 is an isometric of the specific connection pad embodiment of FIG. 1 without the base material and shows the route of the interstitial vias from the mesh planes to the surface.

FIG. 4 is an isometric view showing four vertical vias 300, 302, 304, and 306 with bottom ends at different depths for connecting to different mesh planes (not shown) at those different depths. The vias encircle a horizontal planar decal 308 for soldered connection to an electronic chip. Alternately, the pad could contain a central hole (not shown) for inserting a soldering lead for connection to the pad.

Figure 5:
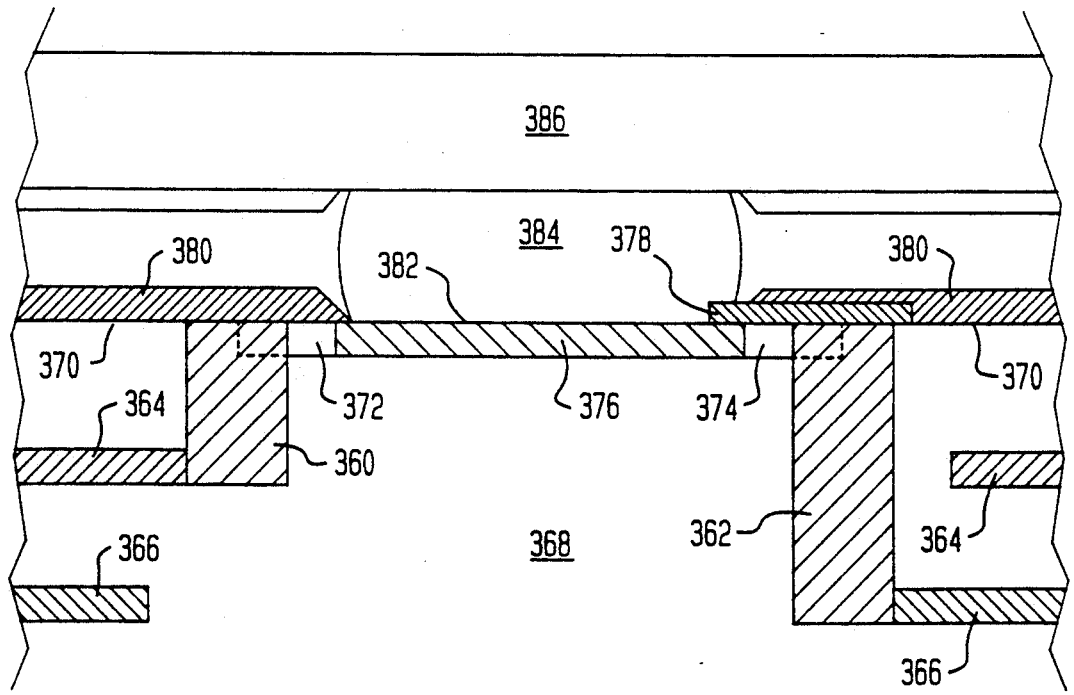
FIG. 5 is an partial cross-sectional elevation of a chip attached to the carrier module of FIG. 3 along the line 5—5.

FIG. 5 illustrates a partial section of a programmed connection pad. Vias 360 and 362 connect between mesh planes 364 and 366, respectively, where each is at a different depth in the body 368 of a carrier module, and surface 370 of carrier module body 368 (e.g., a printed circuit board or chip carrier). The top of the vias 360 and 362 are spaced 372 and 374, respectively, from central land 376. Metal bridge 378 is then deposited to connect between via 362 and land 376. As explained above, deposition can be performed by evaporation, sputtering, laser deposition, fine ion beam writing, and direct writing followed by plate up, as well as other techniques. A passivation layer 380, preferably of polyimide or other suitable organic films is then deposited on surface 370 of carrier module 368 to provide a uniform area 382 prepared for a solder connection. Even at this point in the manufacturing process rework for converting the carrier module 368 for another use is minimal.

Solder ball 384 connects electronic chip 386 to carrier module 354 at prepared area 382. Alternately, a lead of metal directed from the chip could be soldered to the surface of prepared solder area 382 or a hole through the carrier module could be provided at the center of area 382 for soldered connection.

Thus, the carrier module can be designed, tooling can be prepared, and the boards pre-finished to a high level before final determination of power/signal values for each connection pad. The invention allows for a more flexible design of the circuits of the chip and of the carrier module, and carrier modules may be customized for other applications. Turn around time to develop and produce new chips and chip revisions should be substantially shortened by this invention.

As an alternative embodiment, also illustrated by FIG. 5, 368 could be an electronic chip and 386 a carrier module, to provide a programmable pad on the chip so that one chip could be used to perform different functions requiring different power/signal footprints.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A carrier module for connection of electronic chips, comprising:
   a body having a surface for attaching at least one chip;
   vias and lines at the surface of said body for conducting power and signals for said chip;
   a matrix of connection pads on said surface of said body for providing connections from said vias and lines to said chip, at least one of said connection pads being unconnected from any power or signal vias and lines of the carrier module; and
   two or more of said vias and lines positioned proximately about said unconnected pad on said surface such that the pad may be connected by a bridge to any one of the proximate vias and lines for providing a programmable connection pad for said chip.

2. The carrier module of claim 1 in which,
   said matrix is arranged for connection of a VHDLSI chip; and
   a plurality of said matrices of said connection pads are provided on said surface of said body for programmed connection of said VHDLSI chip.

3. The carrier module of claim 1 in which,
   said programmable connection pad includes two to eight cut-out spaces about the edge of the pad; and the programmable pad is encircled by multiple vias and lines of various powers or signals for selection and connection at said cut-out spaces.

4. The carrier module of claim 1 further including, multiple mesh planes at different depths within said body where one or more of said vias and lines are each directed from one of the mesh planes to ends positioned on the surface proximate to said unconnected pad.

5. The carrier module of claim 1 further including a bridge deposited on said body surface to connect between the programmable connection pad and only one of said proximate vias and lines in order to program the connection to said chip.

6. The carrier module of claim 5 further including a passivation layer deposited on said surface of the carrier module to cover said vias and lines and having apertures for soldered connection between the pads and said chip such that vias and lines which are not connected by said bridges to said pads do not erroneously become connected when the chip is soldered to the connection pads.

7. The carrier module of claim 6 in which the passivation layer includes polyimide.

8. The carrier module, as recited in claim 1 wherein surfaces of respective ones of said lines, ends of said vias and said connection pad are substantially planar.

9. An electrical component having a connection surface which can be modified, said connection surface including:
   at least one of at least two via ends and a connection line;
   a planar connection pad located between said at least two via ends having an edge portion adjacent to but spaced from said at least two via ends; and
   an insulating region between said lines, said at least two via ends and said connection pad suitable for application of a bridge connection between said connection pad and said at least one of said at least two via ends and said connection line.

10. An electrical component as recited in claim 9, wherein said surface further comprises:
    at least one of at least two further via ends and a further connection line;
    a further planar connection pad located between said at least two further via ends having an edge portion adjacent to but spaced from said at least two further via ends; and
    a bridge deposited on said planar connection pad and said further planar connection pad to connect between the pads, wherein said bridge covers said at least one of at least two via ends and said at least one of at least two further via ends.

11. An electrical component as recited in claim 9, wherein said electrical component is a chip.

12. An electrical component as recited in claim 9, wherein said electrical component is a carrier module.

* * * * *